(12) United States Patent
Mirkin et al.

(10) Patent No.: US 7,102,656 B2
(45) Date of Patent: Sep. 5, 2006

(54) ELECTROSTATICALLY DRIVEN LITHOGRAPHY

(75) Inventors: Chad A. Mirkin, Wilmette, IL (US); Jung-Hyurk Lim, Evanston, IL (US)

(73) Assignee: Northwestern University, Evanston, IL (US)

( * ) Notice: Subject to any disclaimer, the term of this patent is extended or adjusted under 35 U.S.C. 154(b) by 80 days.

(21) Appl. No.: 10/442,188

(22) Filed: May 21, 2003

(65) Prior Publication Data

US 2004/0008330 A1 Jan. 15, 2004

Related U.S. Application Data

(60) Provisional application No. 60/382,596, filed on May 21, 2002.

(51) Int. Cl.
G01D 15/16 (2006.01)
(52) U.S. Cl. .................................................. 346/140.1
(58) Field of Classification Search ............ 346/140.1; 347/55; 427/96.1, 98.4, 256; 977/DIG. 1
See application file for complete search history.

(56) References Cited

U.S. PATENT DOCUMENTS

| | | | |
|---|---|---|---|
| 4,929,389 A | | 5/1990 | Aldissi |
| 4,968,390 A | * | 11/1990 | Bard et al. .................. 205/115 |
| 5,262,195 A | * | 11/1993 | Moss et al. .................. 427/101 |
| 5,294,372 A | | 3/1994 | Kochem et al. |
| 5,401,537 A | | 3/1995 | Kochem et al. |
| 5,569,798 A | | 10/1996 | Jackson |
| 5,648,453 A | | 7/1997 | Saida et al. |
| 5,670,607 A | | 9/1997 | Chen |
| 5,688,873 A | | 11/1997 | Saida et al. |
| 5,968,417 A | | 10/1999 | Viswanathan |
| 5,976,284 A | | 11/1999 | Calvert et al. |
| 5,989,353 A | | 11/1999 | Skee et al. |
| 6,114,032 A | * | 9/2000 | Kelber ....................... 428/336 |
| 6,267,122 B1 | | 7/2001 | Guldi et al. |
| 6,270,946 B1 | * | 8/2001 | Miller ....................... 430/296 |
| 6,534,329 B1 | | 3/2003 | Heeger et al. |
| 2002/0063212 A1 | | 5/2002 | Mirkin et al. |
| 2002/0122873 A1 | | 9/2002 | Mirkin et al. |
| 2003/0068446 A1 | | 4/2003 | Mirkin et al. |

FOREIGN PATENT DOCUMENTS

| | | |
|---|---|---|
| EP | 0 450 771 A | 10/1991 |
| EP | 0 511 662 A1 | 11/1992 |
| WO | WO 00/41213 A1 | 7/2000 |
| WO | WO 01/91855 A1 | 12/2001 |
| WO | WO 02/ 45215 A2 | 6/2002 |
| WO | WO 03/001633 A | 1/2003 |

(Continued)

OTHER PUBLICATIONS

Knapp, H. F., et al., "Preparation, Comparison and Performance of Hydrophobic AFM Tips", Surface and Interface Analysis, vol. 27, No. 5/6, pp. 324-331 (1999).

(Continued)

Primary Examiner—Thinh Nguyen
(74) Attorney, Agent, or Firm—Foley & Lardner LLP

(57) ABSTRACT

A method of nanolithography includes transporting a patterning compound from a nanoscopic tip to a substrate to form a pattern on the substrate. The patterning compound has a first electrostatic charge and the substrate has a second electrostatic charge which is opposite to the first electrostatic charge. The patterning compound can be an electrically conductive polymer having a charged polymer backbone. The patterns can be dots and lines having lateral dimensions of less than one micron. No electrical bias from an external voltage source between the tip and the substrate is needed.

59 Claims, 4 Drawing Sheets

FOREIGN PATENT DOCUMENTS

| | | |
|---|---|---|
| WO | WO 03/038033 A | 5/2003 |
| WO | WO 03/048314 A2 | 6/2003 |
| WO | WO 03/053845 A2 | 7/2003 |

OTHER PUBLICATIONS

Voigt, J., et al., "Nanofabrication with scanning nanonozzle 'Nanojet'", Microelectronic Engineering, Elsevier, vol. 57-58, pp. 1035-1042 (Sep. 2001).
Copy of PCT International Search Report dated Jun. 29, 2004.
Alivastos, A. P., "Semiconductor Cluster, Nanocrystals, and Quantum Dots", Science, 271, 933 (1996).
Chiang, C. K. et al, "Electrical Conductivity in Doped Polyacetylene", Phys. Rev. Lett., vol. 39, p. 1098 (1977).
Chrisey, L. A. et al., "Covalent attachment of synthetic DNA to self-assembled monolayer films", Nucleic Acids Research, vol. 24, p. 3031 (1996).
Concise Encyclopedia of Polymer Science, "Electrically conductive polymers", J.I. Kroschwitz, pp. 298-300 (1990).
Cui, Y., et al., "Nanowire Nanosensors for Highly Sesitive and Selective Detection of Biological and Chemical Species", Science, vol. 293, pp. 1289-1292 (2001).
Demers, L. M., et al., Orthogonal Assembly of Nanoparticle Building Blocks on Dip-Pen Nanolithographically Generated Templates of DNA, Angew. Chem. Int. Ed., vol. 40, p. 3071 (2001).
Demers, L. M., et al., "Direct Patterning of Modified Oligonucleotides on Metals and Insulators by Dip-Pen Nanolithography", Science, vol. 296, pp. 1836-1838, (2002).
Diaz, A. F. et al, "Electrochemical Polymerization of Pyrrole", J.C.S. Chem. Commun., p. 635 (1979).
Dos Santos, M. C. et al., "Nonlinear Excitations in Pernigraniline, the Oxidized Form of Polyaniline", Phys. Rev. Lett., vol. 62, p. 2499 (1989).
Furukawa, Y., "Electronic Absorption and Vibrational Spectroscopies of Conjugated Conducting Polymers", J. Phys. Chem., vol. 100, pp. 15644-15653 (1996).
Genies, E. M. et al., "Polyaniline: A Historical Survey", Synth. Metals, vol. 36, pp. 139-182 (1990).
Gibson, H. W. et al., "Poly(1,6-heptadiyne), a Free-Standing Polymer Film Dopable to high Electrical Conductivity", J. Am. Chem. Soc., vol. 105, pp. 4417-4431 (1983).
He, H. et al., "A Conducting Polymer Nanojunction Switch", J. Am. Chem. Soc., vol. 123, p. 7730-7731 (2001).
Holdcroft S., "Patterning π-Conjugated Polymers" Adv. Mater., vol. 13, p. 1753 (2001).
Hong, S. et al., "A New Tool for Studying the in Situ Growth Processes for Self-Assembled Monolayers under Ambient Conditions", Langmuir, vol. 15, p. 7897-7900 (1999).
Hong, S. et al., "A Nanoplotter with Both Parallel and Serial Writing Capabilities", Science, vol. 288, p. 1808 (2000).
Im, J. H. et al., "New Amphiphilic Rodlike Polymers with Pendent Hemicyanine Groups", Macromolecules, vol. 33, p. 9606 (2000).
Ito, T. et al, "Simultaneous Polymerization and Formation of Polyacetylene Film on the Surface of Concentrated Soluble Ziegler-Type Catalyst Solution", J. Polym. Sci. Chem. Ed., vol. 12, pp. 11-20 (1974).
Ivanisevic, A. et al., "'Dip-Pen' Nanolithography on Semiconductor Surfaces", J. Am. Chem. Soc., vol. 123, p. 7887-7889 (2001).
Ivanisevic, A., et al., "Redox-Controlled Orthogonal Assembly of Charged Nanostructures", J. Am. Chem. Soc., vol. 123, pp. 12424-12425 (2001).
Ivory, D. M. et al., "Highly conducing charge-transfer complexes of poly(p-phenylene)", J. Chem. Phys., vol. 71, p. 1506 (1979).
Jang, J. et al., "Self-assembly of ink molecules in dip-pen nanolithography: A diffusion model", J. Chem. Phys., vol. 115, p. 2721 (2001).
Jin, R., Y. et al., "Photoinduced Conversion of Silver Nanospheres to Nanoprisms", Science, vol. 294, p. 1901 (2001).
Kanazawa, K. K. et al, "'Organic Metals': Polypyrrole, a Stable Synthetic 'Metallic' Polymer", J.C.S. Chem. Commun., p. 854 (1979).
Kittlesen, G. P. et al., "Chemical Derivatization of Microelectrode Arrays by Oxidation of Pyrrole and N-Methylpyrrole: Fabrication of Molecule-Based Electronic Devices", J. Am. Chem. Soc., vol. 106, pp. 7389-7389 (1984).
Lee, Gil U., et al., "Direct Measurement of the Forces Between Complementary Strands of DNA", Science, vol. 266, (Nov. 4, 1994).
Li, Y. et al., "Electrochemical AFM 'Dip-Pen' Nanolithography", J. Am. Chem. Soc., vol. 123, p. 2105-2106 (2001).
Lim and Mirkin, "Electrostatically Driven Dip-Pen nanolithography of Conducting Polymers", Adv. Mater. vol. 4, No. 20, pp. 1474-1477 (Oct. 16, 2002).
Loiacono, M. J et al., "Investigation of Charge Transport in Thin, Doped Sexithiophene Crystals by Conducting Probe Atomic Force Microscopy", J. Phys. Chem. B. vol. 102, p. 1679 (1998).
Macdiarmid, A. G. et al., "Organic Metals and Semiconductors: The Chemistry of Polyacetylene, $(CH)_x$, and Its Derivatives", Synth. Metals, vol. 1, p. 101 (1980).
Maynor, B. W. et al., "Direct-Writing of Polymer Nano-structures: Poly(thiopene) Nanowires on Semiconducting and Insulating Surfaces", J. Am. Chem. Soc., vol. 124, p. 522 (2002).
Moriguchi, I. et al., "Construction of Nanostructured Carbonaceous Films by the Layer-by-Layer Self-Assembly of Poly(diallyldimethylammonium) Chloride and Poly(amic acid) and Subsequent Pyrolysis", Chem. Mater., vol. 11, p. 1603 (1999).
Nigrey, P. J. et al, Electrochemistry of Polyacetylene, $(CH)_x$: Electrochemical Doping of $(CH)_x$ Films to the Metallic State, J.C.S. Chem. Commun., p. 594 (1979).
Noy, A. et al., "Fabrication of Luminescent Nanostructures and Polymer Nanowires Using Dip-Pen Naolithography", Nano Lett., vol. 2, p. 109 (2002).
Schott, M., et al., "Introduction to Conjugated and Conducting Polymers", Organic Conductors, Fundamentals and Applications, Chptr. 11 (1994).
Piner, R. D., et al., "'Dip-Pen' Nanolithography", Science, vol. 283, p. 661 (1999).
Shirakawa, H. et al, Synthesis of Electrically Conducting Organic Polymer: Halogen Derivatives of Polyacetylene, $(CH)_x$ J.C.S. Chem. Commun., p. 578 (1977).
Dos Santos et al., "Elementary Excitations in Poly-P-Phenylene Imine, The Oxidized Form of Polyaniline", SYNTH, Metals, vol. 29, p. E321 (1989).
Tatsuma, T. et al., "Reversible Electron Transfer Reaction between Polyaniline and Thiol/Disulfide Couples", J. Phys. Chem., vol. 100, pp. 14016-14021 (1996).
Tourillon, G. et al., "New Electrochemically Generated Organic Conducting Polymers", J. Electroanal. Chem., vol. 135, p. 173 (1982).
Weeks, B. L. et al., "Effect of Dissolution Kinetics on Feature Size in Dip-Pen Nanolithography", Phys. Rev. Lett., vol. 88, No. 25, p. 255505-1 through 255505-4 (2002).
Weinberger, D. A. et al., "Combinatorial Generation and Analysis of Nanometer- and Micrometer-Scale Silicon Features via 'Dip-Pen' Nanolithography and Wet Chemical Etching", Adv. Mater., vol. 12, p. 1600 (2000).
PCT International Search Report, PCT/US03/15833 (May 13, 2004).

* cited by examiner

ELECTROSTATICALLY DRIVEN LITHOGRAPHY

CROSS-REFERENCE TO RELATED APPLICATIONS

This application claims the benefit of provisional patent application entitled "Electrostatically Driven Dip-Pen Nanolithography of Conducting Polymers" by Lim and Mirkin, Ser. No. 60/382,596, filed May 21, 2002, which is hereby incorporated by reference in its entirety.

STATEMENT OF GOVERNMENT FUNDING

The inventions herein were developed under grants from the following federal government funding sources: Air Force Office of Scientific Research, Grant No. F49620-00-1-0283/P01; Defense Advanced Research Projects Agency (DARPA), Grant No. DAAD 19-00-1-0414; and the National Science Foundation, Grant No. ECC-0118025. The government retains certain rights in the invention.

BACKGROUND

Considerable interest has arisen in the development of nanotechnological methods for the miniaturization, printing, and fabrication of nanoscale electronic and optical devices (see, for example, references 1–3, at the end of the specification). One proprietary, commercial method is DIP PEN NANOLITHOGRAPHY™ printing (DPN™ printing) (see, for example, referenced 4–6; DIP PEN NANOLITHOGRAPHY™ and DPN™ are proprietary trademarks of NanoInk, Inc., Chicago, Ill. and are used accordingly in this specification). Several embodiments exist for this promising new nanofabrication tool, which allows one to pattern molecules and other patterning inks on a variety of surfaces using nanoscopic tips including scanning probe microscopic (SPM) tips. In one embodiment, patterning is carried out with a coated atomic force microscope (AFM) tip in a controlled fashion on the sub-100 nm to many micrometer length scale (see, for example, references 5–6). In a typical printing experiment, a commercially available AFM cantilever can be coated with ink molecules by thermal evaporation or by dip-coating procedures (see, for example, references 4 and 10). The ink molecules can be transported to a substrate, often via capillary action, by bringing the tip into contact with the surface. Chemisorption of the ink to the underlying substrate can be used as a driving force for moving the molecules from the tip to the substrate. Significant work thus far has been done, for example, with the thiol-gold combination.

Despite the advances in the field, a commercial need exists to expand the scope of nanolithographic printing, including the mechanisms which can be used to bind the patterning compound with the substrate to impart technologically useful properties, particularly electrical and optical properties for use in nanoelectronic and nanooptical devices. With improved knowledge, for example, less experimentation may be needed to solve a particular technical challenge and additional tools are available to solve particular technical challenges. For example, printing of synthetic polymeric compounds is important, as is the printing of conducting materials and conducting organic materials. These include electronically conducting and light emitting conducting polymers to form nanowires, nanoscale light emitting diodes, and nanocircuitry. Printing with use of additional interactions to drive the printing besides chemisorption, covalent bonding, or physisorption is desired. Printing on semi-conductor and insulating, dielectric substrates is desired. Better surface modification processes are desired.

U.S. Pat. No. 6,270,946 (Miller, listed assignee: Luna Innovations) discloses nonlithographic use of ionic interactions among difunctional molecules to build layers of multilayer films. No working examples, however, are provided.

SUMMARY

This invention encompasses a series of embodiments, and this summary section should not be construed to limit the scope of the invention.

In one aspect, the invention provides a method of nanolithography comprising transporting a patterning compound from a nanoscopic tip to a substrate surface to form a pattern on the substrate surface, wherein the patterning compound has a charged polymeric backbone with a first electrostatic charge and the substrate surface comprises functional groups which provide a second electrostatic charge which is opposite to the first electrostatic charge. By this method, a pattern on a substrate surface can be prepared. In one embodiment, the first electrostatic static charge of the polymeric backbone is a positive charge and the second electrostatic charge of the substrate surface functional groups is a negative charge. In an alternative embodiment, the first electrostatic static charge of the polymeric backbone is a negative charge and the second electrostatic charge of the substrate surface functional groups is a positive charge. The nanoscopic tip can be a scanning probe microscopic tip such as an atomic force microscopic tip. The nanoscopic tip can be a non-hollow tip and the patterning compound can be coated on the nanoscopic tip before it is transported. Alternatively, the nanoscopic tip can be a hollow tip and the patterning compound can be transported through the hollow tip. The patterning compound can be transported in an ink composition comprising the patterning compound, and the ink composition can comprise water. The pattern can be at least one dot or, alternatively, at least one line. The pattern can have a lateral dimension of about one micron or less. The patterning compound can be a conducting polymer.

The invention also provides a method comprising: (a) providing a polymer comprising a charged polymer backbone; (b) providing a charged surface which is oppositely charged; (c) providing an atomic force microscope tip; (d) coating the atomic force microscope tip with the polymer; and (e) transporting the polymer to the charged surface from the atomic force microscope tip to form a pattern of the polymer on the surface. By this method, a pattern on a surface can be prepared.

In addition, the invention provides a method for direct-write nanolithography without use of photomasks, photoresists, stamps, or electrically biased nanoscopic tips or substrates, consisting essentially of: (a) providing an electrostatically charged substrate surface consisting essentially of charged functional groups, (b) providing an atomic force microscope tip coated with an electrostatically charged patterning compound consisting essentially of a charged polymer backbone, wherein the charged substrate and the charged patterning compound are oppositely charged, (c) contacting the coated tip with the substrate to transport the charged patterning compound to the charged substrate surface and form nanoscale patterns on the surface.

Another embodiment is for a nanolithographic method consisting essentially of: lithographically transporting a patterning compound from a tip to a substrate surface to form a pattern on the substrate surface, wherein the patterning compound is a charged synthetic polymeric compound with a first electrostatic charge and the substrate surface comprises functional groups which provide a second electrostatic charge which is opposite to the first electrostatic charge, wherein the pattern has a resolution of about 500 nm or less.

The invention also provides a nanolithographically patterned substrate comprising: (a) a substrate with a substrate surface, and (b) at least one nanostructure pattern on the substrate surface comprising a patterning compound, wherein the patterning compound has a charged polymeric backbone with a first electrostatic charge, wherein the substrate comprises functional groups which provide a second electrostatic charge which is opposite to the first electrostatic charge.

Another aspect of the invention is an electronic, optical, or sensing device comprising: (a) a substrate with a substrate surface, and (b) at least one nanostructure pattern on the substrate surface comprising a patterning compound, wherein the patterning compound has a charged polymeric backbone with a first electrostatic charge, wherein the substrate surface comprises functional groups which provide a second electrostatic charge which is opposite to the first electrostatic charge.

Advantages of the invention include the ability to bind polymeric materials to substrates, forming stable electronically conductive nanostructures on semi-conducting substrates. The ability to directly fabricate conductive or semi-conductive nanostructures with a high degree of control over location and geometry, as well as alignment, is of significant commercial value in nanotechnology.

(A) lateral force mode (LFM) image of SPAN dots as a function of tip-substrate contact time. The contact time (s) and measured diameter of the dots (nm) for the identification letters are the following: A, 0.2, 130; B, 0.4, 195; C, 0.8, 314; D; 1, 469; E, 2, 625; F, 3, 859; G, 4, 977; H, 6, 1172; I, 8, 1367.

(B) LFM image of PPy dots as a function of tip-substrate contact time; A, 1, 255; B, 2, 375; C, 3, 461; D, 4, 576; E, 5, 691; F, 6, 778; G, 8, 893; H, 10, 1095; I, 12, 1290.

(C) Plot of the feature radius as a function of t½ for SPAN.

(D) Plot of the feature radius as a function of t½ for PPy.

Figure 3:
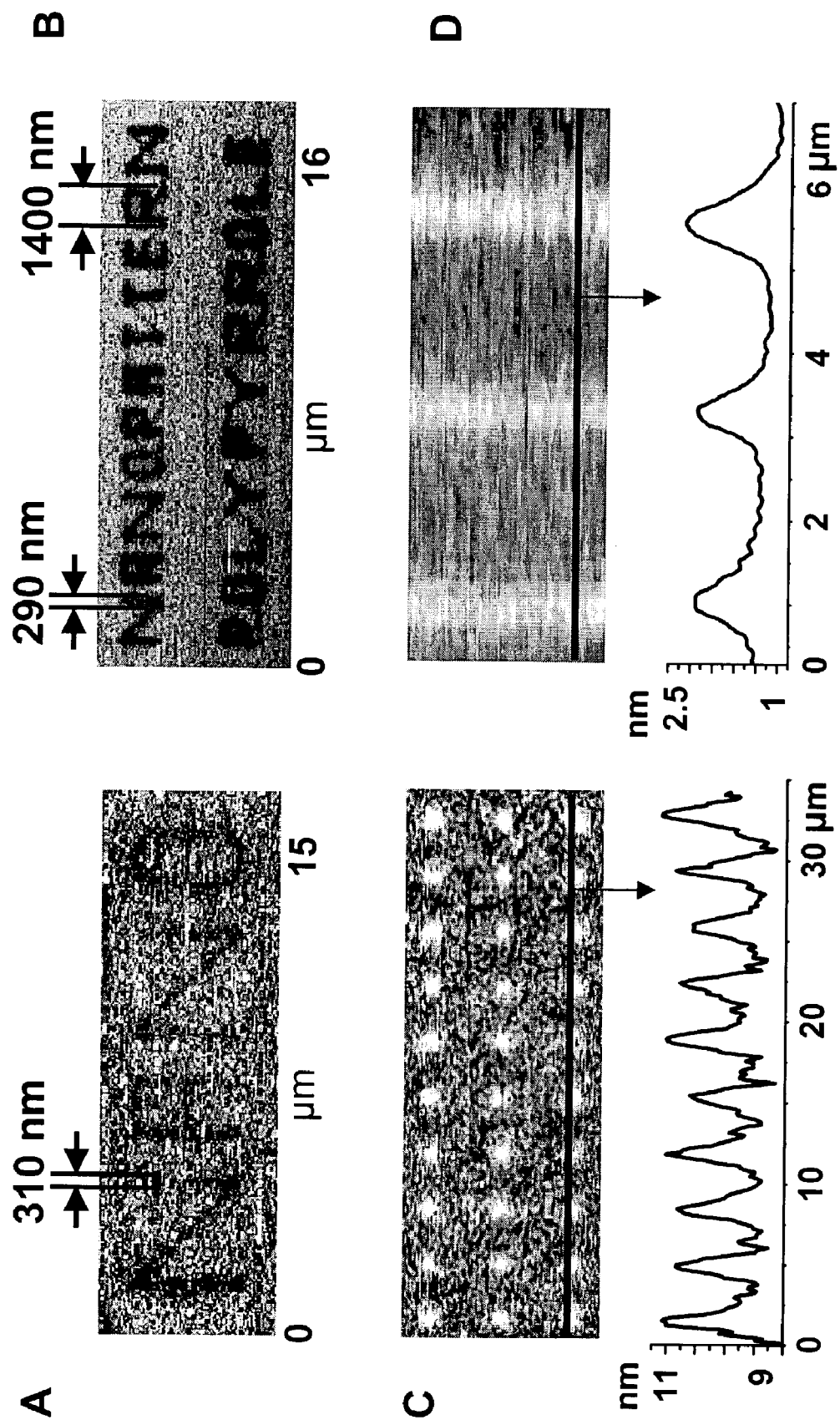

FIG. 3 provides LFM and AFM images of nanolithographically-generated conducting polymer nanostructures on modified silicon surfaces. All images were recorded at a scan rate of 4 Hz.

(A) LFM image of a SPAN nanopattern written at 0.85 mm/s.

LFM image of PPy nanopattern written at 0.8 mm/s.

(C) Topography image of SPAN dots and the cross-sectional profile of the line. The contact time was 6 s for each dot.

(D) Topography image of PPy lines at 0.5 mm/s and the cross-sectional profile of the line.

Figure 4:
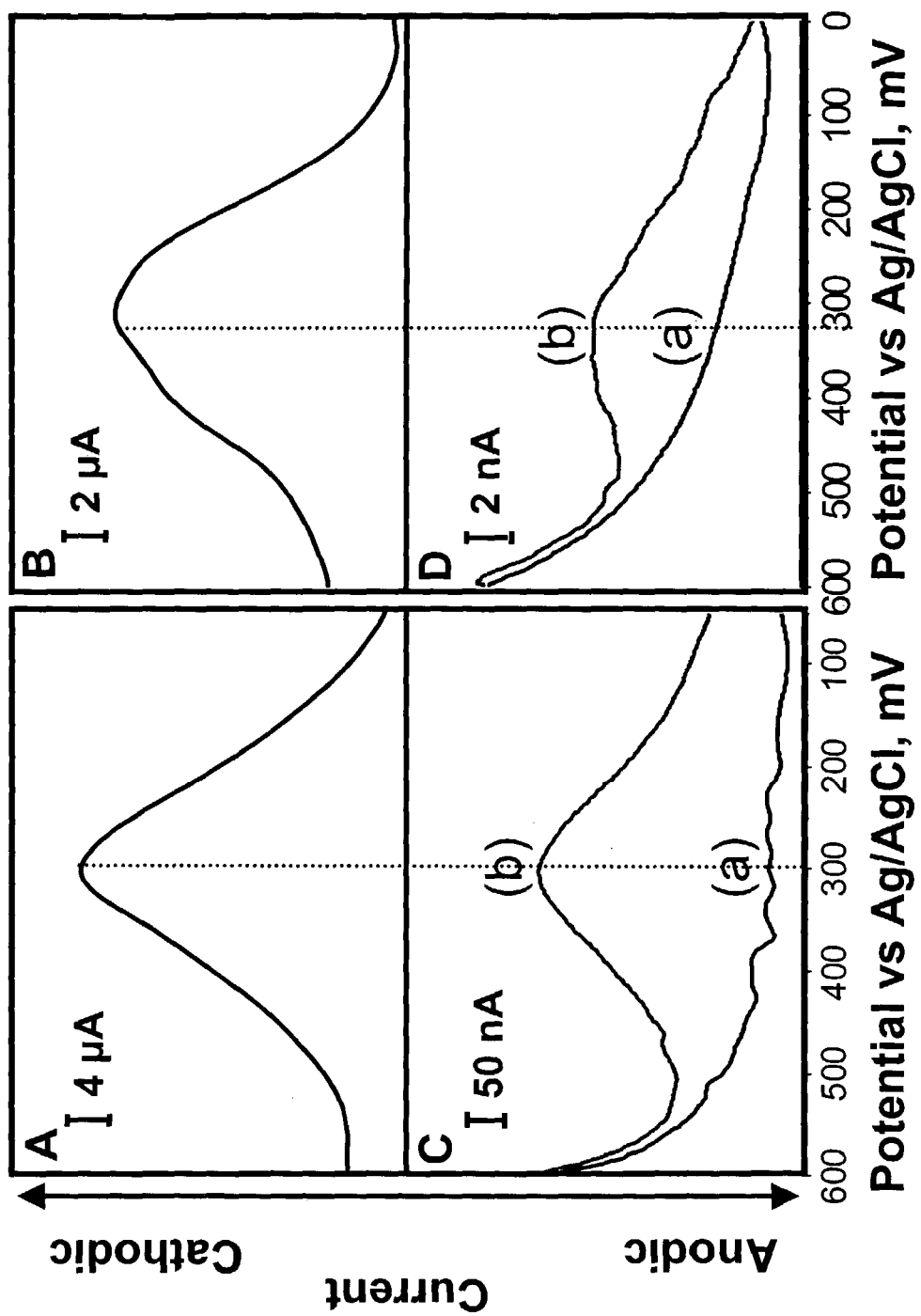

FIG. 4 provides (A) DPV of SPAN in 0.2 M NaCl electrolyte containing 0.005% SPAN. (B) DPV of PPy in 0.2 M NaCl electrolyte containing 0.005% SPAN. (C) DPV of an electrode painted with SPAN via nanolithographic printing. (a): Au/cystamine SAM, (b): Au/cystamine SAM patterns. (D) DPV of an electrode painted with PPy via nano-lithographic printing. (a): Au/thioctic acid SAM, (b): Au/thioctic acid SAM patterns. For DPV experiments: scan rate=20 mV/s; pulse period=200 ms; pulse amplitude=50 mV/s; and pulse width=50 ms.

DETAILED DESCRIPTION

In practicing the present invention, one skilled in the art can refer to texts and publications in the field for guidance. By citing these references, no admission is made that any of these reference are prior art. Useful texts and publications include the 25 references cited at the end of the specification and the following patent documents. Also useful is Marc J. Madou, *Fundamentals of Microfabrication, The Science of Minitiaturization*, $2^{nd}$ Ed., CRC Press, 2002 which describes lithography and nanolithography (see chapters 1–3 for example and discussion of conductive polymer patterning at pages 167 and 169).

A. co-pending U.S. regular patent application Ser. No. 09/477,997 filed Jan. 5, 2000 ("Methods Utilizing Scanning Probe Microscope Tips and Products Therefor or Produced Thereby") to Mirkin et al. (PCT Counterpart is WO 00/41213 to Mirkin et al., published Jul. 13, 2000).

B. U.S. patent publication number 2002/0063212 A1 published May 30, 2002 ("Methods Utilizing Scanning Probe Microscope Tips and Products Therefor or Produced Thereby") to Mirkin et al.

C. U.S. patent publication number 2002/0122873 A1 published Sep. 5, 2002 ("Nanolithography Methods and Products Produced Therefor and Produced Thereby") to Mirkin et al.

D. U.S. application Ser. No. 60/326,767 filed Oct. 2, 2002, ("Protein And Peptide Nanoarrays"), now published as US patent publication no. 20030068446 to Mirkin et al. (published Apr. 10, 2003).

E. co-pending U.S. regular application Ser. No. 10/307,515 filed Dec. 2, 2002 to Mirkin et al.

F. co-pending U.S. regular application Ser. No. 10/320,721 filed Dec. 17, 2002 to Mirkin et al.

G. co-pending U.S. regular application Ser. No. 10/366,717, filed Feb. 14, 2003 ("Method and Apparatus for Aligning Patterns on a Substrate");

H. PCT publication WO 02/45215 to Mirkin et al., published Jun. 6, 2002.

Patent documents A–H are hereby incorporated by reference in their entirety. In particular, in prior application Ser. No. 09/866,533, filed May 24, 2001 (reference B, 2002/0063212 A1 published May 30, 2002), direct-write nano-lithographic printing background and procedures are described in detail covering a wide variety of embodiments including, for example, for example: background (pages 1–3); summary (pages 3–4); brief description of drawings (pages 4–10); use of scanning probe microscope tips (pages 10–12); substrates (pages 12–13); patterning compounds (pages 13–17); practicing methods including, for example, coating tips (pages 18–20); instrumentation including nanoplotters (pages 20–24); use of multiple layers and related printing and lithographic methods (pages 24–26); resolution (pages 26–27); arrays and combinatorial arrays (pages 27–30); software and calibration (pages 30–35; 68–70); kits and other articles including tips coated with hydrophobic compounds (pages 35–37); working examples (pages 38–67); corresponding claims and abstract (pages 71–82); and FIGS. 1–28. This disclosure is not and need not be repeated here but is hereby incorporated by reference in its entirety.

Also, US patent publication 2002 0122873 A1, published Sep. 5, 2002 to Mirkin et al., (reference C) is not and need not be repeated here but is hereby incorporated by reference in its entirety. This published application includes, for example, use of tips which have external openings and internal cavities, and use of electrical, mechanical, and chemical driving forces for transporting the ink (or deposition compound) to the substrate. One method includes aperture pen nanolithography, wherein the rate and extent of the movement of the deposition compound through the aperture is controlled by the driving force. This published application also describes coated tips, patterns, substrates, inks, patterning compounds, deposition compounds, multiple tip nanolithography, multiple deposition compounds, arrays.

Also incorporated by reference in its entirety is (a) provisional patent application 60/382,596 filed May 21, 2002 to Mirkin et al., and (b) counterpart publication by Lim and Mirkin, *Adv. Mater.*, 2002, 14, No. 20, October 16, 1474-1477, particularly for its disclosure concerning the deposition of conductive polymers with use of nanolithographic printing.

The nanolithographic printing technique can be dependent upon environmental conditions including, for example, humidity, temperature, tip coating procedures, and substrate-ink interactions (see, for example, references 7–9). Printing of sulfur-containing patterning compounds on gold can be carried out but, in addition, nanolithographic printing can be used with a variety of other ink-substrate combinations, including silazane inks-with oxide semiconductor substrates (see reference 11), metal salt or monomer inks on electrically biased semiconductors (see references 12–13), functionalized oligonucleotides (DNA) on gold or monolayer-modified gold or oxide substrates (see reference 9), and optical dyes on glass by physisorption (see reference 14). For each substrate-ink combination, factors such as environmental conditions, humidity, temperature, ink additives, and tip coating procedures can be examined to optimize the process including reproducibility optimization. Controlled environmental chambers can be useful. Nanolithographic printing can be carried out with use of tools, software, and kits provided by Nanolink, Inc., Chicago, Ill. under the proprietary marks of DPN and DIP PEN NANOLITHOGRAPHY.

Figure 1:
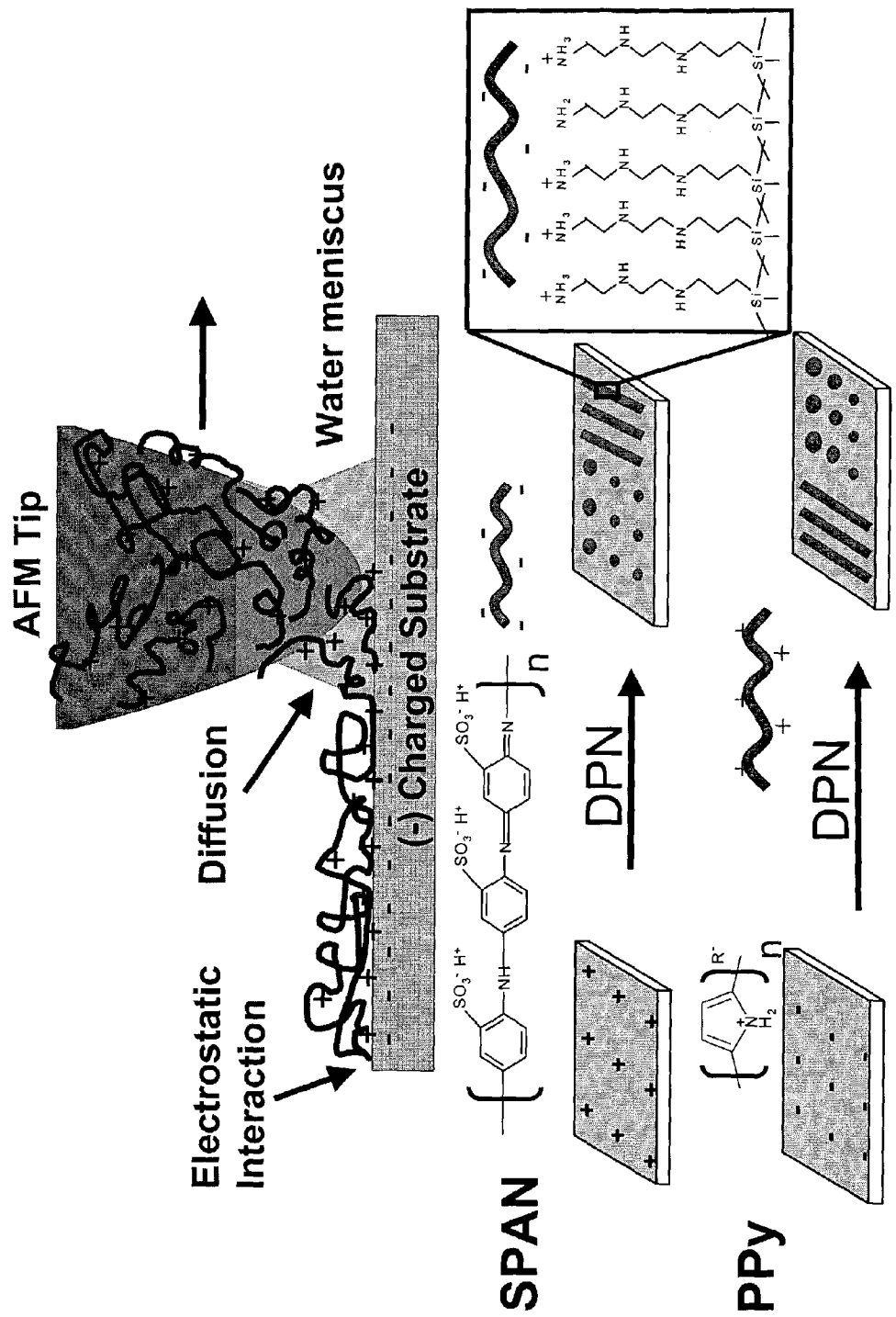
FIG. 1 provides a schematic representation of nanolithographic printing for charged conducting polymers.
Figure 2:
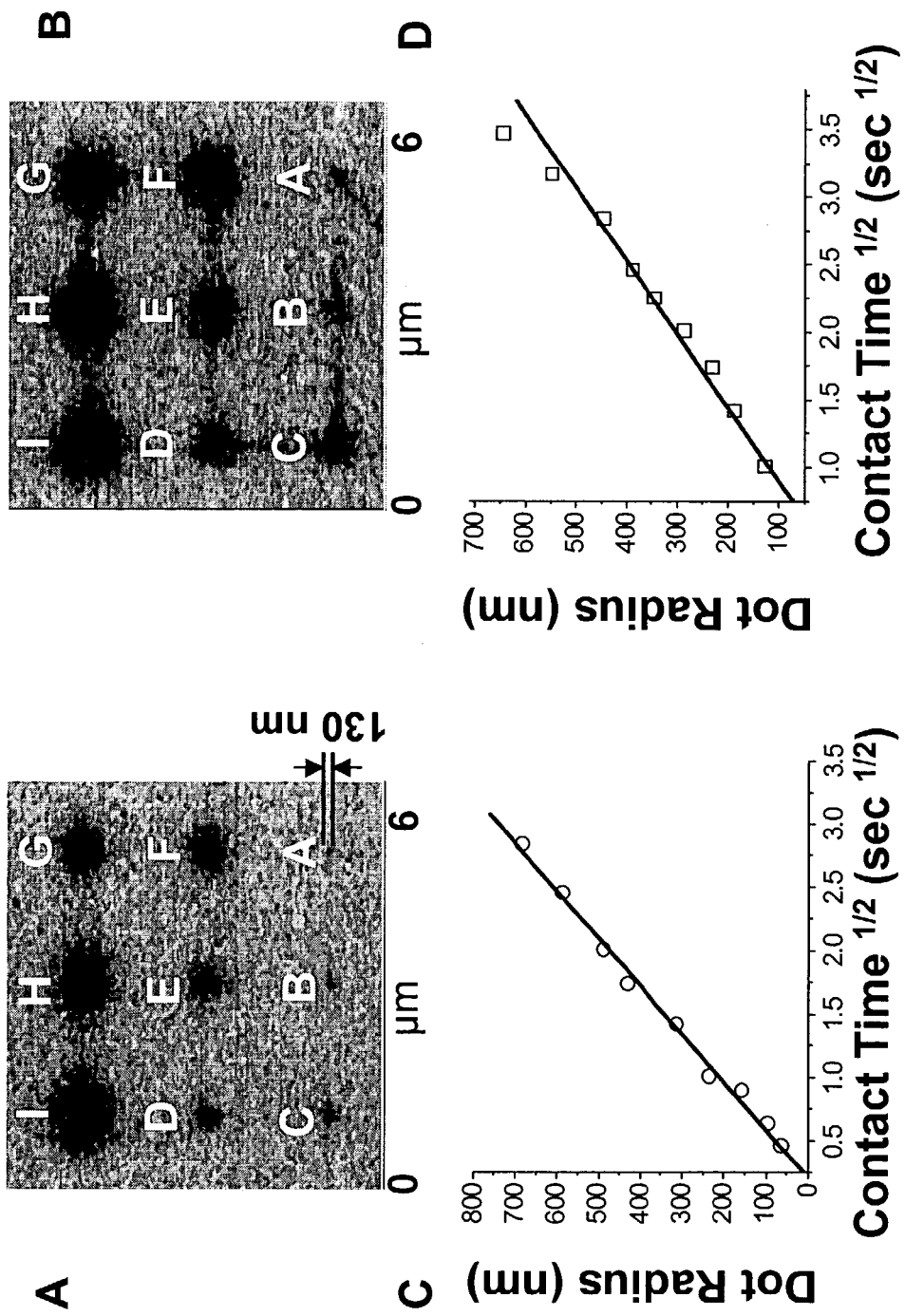
FIG. 2 illustrates diffusion properties of conducting polymers transported onto modified silicon substrates.

In particular, the present invention relates to the use of electrostatic interactions as a driving force for the nanolithographic printing process in order to pattern nanostructures. A preferred embodiment is illustrated in FIG. 1, which shows a method of nanolithography comprising the transport of a patterning compound from a nanoscopic tip to a substrate to form a pattern. Additional preferred embodiments are described below in the Working Examples and illustrated in FIGS. 2–4.

The patterning compound has a charged polymeric backbone with a first electrostatic charge. The substrate comprises a surface with functional groups which provide a second electrostatic charge which is opposite to the first electrostatic charge. In one embodiment, the first electrostatic charge on the patterning compound is a positive charge and the second electrostatic charge on the substrate surface is an opposite negative charge. In another embodiment, the first electrostatic charge is a positive charge and the second electrostatic charge is an opposite negative charge. The first electrostatic charge is part of the patterning compound and cannot be exchanged off of the compound by ion exchange methods. The counterion, however, can be subjected to ion exchange and a particular counterion can be removed from the patterning compound. Similarly, the second electrostatic charge is part of the functional groups on the substrate surface which cannot be exchanged off of the surface by ion exchange methods. The counterion of the surface functional groups, however, can be subjected to ion exchange and removed. The extent of charge separation can be varied depending on the environmental conditions. The counterions of the patterning compound and the counterions of the surface functional groups can be exchanged as the patterning compound is transferred to the surface and the first and second electrostatic charges interact, although the scientific understanding of the process may not be fully understood. In general, the patterning compound can be designed to have a plurality of charges along the polymer backbone but is not generally difunctional. The number of monomer repeat units is not particularly limited, but generally is sufficiently high to provide for a solid structure and provide conduction to the polymer in a conjugated backbone system. The number average molecular weight (g/mol) can be, for example, at least about 1,000 to about 1,000,000. In one embodiment, each monomer repeat unit comprises an electrostatic charge site. In another embodiment, the charge site density along the polymer chain can be adjusted by the extent of doping of the patterning compound when it is a conjugated, conducting polymer.

For example, FIG. 1 illustrates use of (1) a polymer chain patterning compound carrying negative electrostatic charges (SPAN) which is printed onto a substrate surface having positive electrostatic charges, and (2) a polymer chain patterning compound carrying positive charges (Ppy) which is printed onto a substrate surface having negative charge. Doping is used to provide the polymer chain with electrostatic charge sites and higher conductivity. Electrostatic interactions facilitate the transport and binding of the patterning compound to the substrate surface. The process can be described also as a charge induced deposition process. By this method, molecules can be bound to the substrate surface by non-covalent bonding.

FIG. 1 illustrates the potential role of diffusion and water meniscus in the transport process with use of an AFM tip, although the mechanism of the transport, including the role of the meniscus and diffusion, can be varied depending on the nature of the printing. The present invention is not limited by any particular scientific theory regarding the meniscus and the diffusion, so long as controlled transport can be accomplished and the patterning compound can be printed onto the substrate surface.

The first electrostatic charge in the patterning compound can arise from ionic charge separation known to exist in, for example, ionic compounds which ionize such as polyelectrolytes, including the cationic and anionic types. For example, strongly acidic groups such as sulfonate or phosphate generate negative charges. Quaternary ammonium groups generate positive charges. The counterion must be sufficiently mobile enough to allow for the charge separation and the transport of the charged patterning compound to the substrate surface. Examples include proton, sodium, and potassium. The ink medium for the patterning compound can facilitate the charge generation used to facilitate the transport. The first electrostatic charge does not arise from mere dipole moments in the patterning compound generated by polar covalent bonds.

Similarly, the second electrostatic charge on the substrate is localized on the surface of the substrate and charge generation can be facilitated by the ink medium. The second electrostatic charge also does not arise from mere dipole moments in the substrate surface. Nor does it arise merely by application of an electrical bias by, for example, coupling the substrate with the power supply.

The nanoscopic tip can be, for example, a scanning probe microscopic tip including, for example, an atomic force microscopic tip. The patterning compound can be coated onto the nanoscopic tip prior to transport. The nanoscopic tip can be a hollow tip, and the patterning compound can be transported through the hollow tip. The nanoscopic tip can be used in a manner which makes it not electrically biased during transport.

The patterning compound can be transported in an ink composition comprising the patterning compound. For example, carriers and additives can be used as needed to improve the transport.

The shape of the pattern is not particularly limited but can be, for example, a dot or a line, including pluralities of dots and pluralities of lines, and combinations thereof. The pattern can have a lateral dimension such as a length or a width, including a line width or a dot diameter. The lateral dimension can be, for example, about one micron or less, or about 500 nm or less, or about 130 nm to about 1.3 micron, or about 100 nm to about 500 nm, or about 130 nm to about 500 nm. The pattern can have a height of, for example, about 1 nm to about 5 nm. Arrays can be produced comprising 10,000 or more, or 100,000 or more, individual patterns with distances between the individual patterns of less than 100 nm. In general, high resolution patterning and lithography is preferred, wherein for example the pattern has a resolution of about 500 nm or less, more particularly, about 250 nm or less, more particularly about 100 nm or less. Resolution can be determined by measurement of the distances between the individual patterns of the larger pattern.

High density patterning is also preferred. A larger array can also be characterized by a pattern separation distance, wherein the spacing between the central parts of an individual pattern are measured. This pattern separation distance can be, for example, 1,000 nm or less, 500 nm or less, 200 nm or less, or 100 nm or less.

The substrate and its surface is not particularly limited and can be homogeneous or heterogeneous, multi-layered or single-layered. It can comprise a non-electrically conductive, dielectric, semiconductor, and conductive elements and surfaces. The substrate can be a wafer such as a semiconductive wafer or an electrode such as a metallic electrode including gold electrodes. The substrate can be prepared by, for example, surface modification and/or cleaning to provide it with an electrostatically charged surface, whether a cationic surface or an anionic surface. Bronsted acidic or basic sites can be present at the surface. The number of electrostatic groups at the surface can be tailored to provide the best transport. Surface coupling agents, well-known in the art, can be used including silane coupling agents or adhesion promoters such as amino functional silane coupling agents. In a preferred embodiment, a solid silicon wafer is treated to provide it with a thin layer or monolayer of ionic groups. Examples in the patent literature for cleaning wafers include U.S. Pat. Nos. 5,989,353 to Shee et al. ("Cleaning Wafer Substrates of Metal Contamination While Maintaining Wafer Smoothness") and 6,267,122 to Guldi et al. ("Semiconductor Cleaning Solution and Method").

In general, the substrates should not be allowed to sit for too long in the open atmosphere (ambient) before transport is carried out. The time between substrate preparation and transport can be varied to determine the effect on the transport experiments. Substrate preparation can be carried out, preferably, within about two hours of the transport.

The patterning compound can be an electrostatically charged polymer. For example, the patterning compound can be an electrostatically charged synthetic polymer. The patterning compound can be a water-soluble conducting polymer. Depending on the doping state, the conducting polymer can be semiconducting or conducting, but for purposes of this invention, a semiconducting polymer is a conducting polymer if it can be sufficiently doped or otherwise modified to make it conducting. The polymer can comprise a conjugated polymer backbone, resulting in electron delocalization and low energy optical transitions, and these types of polymers are known in the art as conducting polymers. Conducting polymers are an important class of materials because of their potential applications in electrical, optical, and sensing devices (see for example references 15–17). Prototypical electronic conducting polymers include polyacetylene, polydiacetylene, poly(phenylene vinylene) (PPV), poly-para-phenylene, polypyrrole, polyaniline, polythiophene, and the like. Doping can be used for conducting polymers such as polyaniline and polypyrrole to improve their conductivities, as well as their solubilities in water (see for example reference 18). Self-doped sulfonated polyaniline (SPAN) and doped polypyrrole (PPy), for example, have charged backbones and have high solubilities in water. PPV can be made with use of water-soluble precursors as well which can be used with doping agents. With charged polymers, one can construct monolayers on oppositely charged surfaces utilizing electrostatic interactions (see, for example, references 19 and 20).

Patent literature which describes a variety of conducting and semiconducting polymers includes: (a) U.S. Pat. Nos. 4,929,389 to Aldissi ("Water-Soluble Conductive Polymers"); (b) 5,294,372 and 5,401,537 to Kochem et al. ("Aqueous Dispersions of Intrinsically Electroconductive Polyalkoxythiophenes, a Process for their Preparation and their Use"); (c) 5,670,607 to Chen ("Miscible Forms of Electrically Conductive Polyaniline"); (d) 5,569,798 to Wudl et al. ("Self-Doped Polymers"); (e) 5,648,453 and 5,688,873 to Saida et al. ("Electroconductive Polymer and Process for Producing the Polymer"); (f) 5,968,417 to Viswanathan ("Conducting Compositions of Matter"); and (g) 6,534,329 to Heeger et al. ("Visible Light Emitting Diodes Fabricated from Soluble Semiconductor Polymers"), and are each hereby incorporated by reference for their entire teachings including synthesis and characterization. These patents, for example, describe covalently linking Bronsted acid groups to polymer backbones, zwitterionic structures, self-doping, doping with acceptors and donors which oxidize or reduce the polymer chain, cycling between neutral and ionic states, stability, and pi-conjugation of electronic systems which provides semiconducting or conducting behavior. In addition, the many applications of conducting polymers are described.

Electrically conductive polymers are also described in, for example, *Concise Encyclopedia of Polymer Science*, J. I. Kroschwitz, Ex. Ed., John Wiley, 1990, pages 298–300, which is hereby incorporated by reference. The polymers are described as having conjugated pi-electron backbones which can provide properties such as, for example, low energy optical transitions, low ionization potentials, and high electron affinities. They can be oxidized or reduced more readily than conventional polymers. Doping of the following types of conductive polymers is described: polyacetylene, poly(p-phenylene), poly(p-phenylene sulfide), polypyrrole, and polythiophene.

Additional conducting polymers and their use in patterning on various substrates is described in U.S. Pat. No.

5,976,284 to Calvert et al. ("Patterning Conducting Polymer Surfaces and Process for Preparing the Same and Devices Containing the Same"). This '284 patent teaches that, in principle, any polymer having an electrical conductivity of at least sigma $>10^{-3}$ S/cm, preferably at least sigma $>10^{-1}$ S/cm, can be used as the conducting polymer. Also, conducting polymers are described in Chapter 11 of Organic Conductors, J. P. Farger, Ed. Marcel Dekker, NY, N.Y., 1994, which is incorporated herein by reference. Conducting polymers include, e.g., cis and trans polyacetylenes (PA), polydiacetylenes (PDA), polyparaphenylenes (PPP), polypyrroles (PPy), polythiophenes (PT), polybithiophenes, polyisothianaphthene, polyphenylenevinylenes (PPV), polythienylvinylenes (PTV), polyphenylenesulfide (PPS), and polyaniline (PAni), and the structures of these polymers are shown in the '284 patent. In these structures, it is to be understood that H atoms may be replaced by substituents, such as $C_{1-18}$-alkyl, or phenyl or groups containing ionic groups such as carboxylate or sulfonate. These groups may be attached directly or through ester, ether, or amide links. In general, substitution worsens the electrical conductivity of the conducting polymer, but may enhance features such as solubility or orientation at the air/water interface, for example. Other references which further describe the synthesis and properties of these conducting polymers include: M. F. Combarel et al, C. R. Acad. Sci. Ser. C, vol. 262, p. 459 (1966); L. T. Yu et al, J. Polym. Sci. Symp. C, vol. 16, p. 2931 (1967); M. Doriomedoff et al, J. Chim. Phys. (Paris), vol. 68, p. 39 (1971); T. Ito et al, J. Polym. Sci. Chem. Ed., vol. 12, p. 11 (1974); H. Shirakawa et al, Chem. Commun., p. 578 (1977); C. K. Chiang et al, Phys. Rev. Lett., vol. 39, p. 1098 (1977); P. J. Nigrey et al, Chem. Commun., p. 594 (1979); A. G. MacDiarmid et al, Synth. Metals, vol. 1, p. 101 (1980); D. M. Ivory et al, J. Chem. Phys., vol. 71, p. 1506 (1979); A. F. Diaz et al, Chem. Commun., p. 635 (1979); K. K. Kanazawa et al, Chem. Commun., p. 854 (1979); G. Tourillon et al, J. Electroanal. Chem., vol. 135, p. 173 (1982); E. M. Genies et al, Synth. Metals, vol. 36, p. 139 (1990); H. W. Gibson et al, J. Am. Chem. Soc., vol. 105, p. 4417 (1983); M. C. Dos Santos et al, Phys. Rev. Lett., vol. 62, p. 2499 (1989); Synth. Metals, vol. 29, p. E321 (1989); H. Kiess, ed., Conjugated Conducting Polymers, Springer Series in Solid State Sciences, Vol. 102, Springer-Verlag, Berlin, 1992.

Conducting polymers can be obtained commercially. Conducting polymer solutions can be prepared, for example, and tailored with solvent additions and co-solvents to promote use with the nanoscopic tip, be it a hollow or non-hollow tip. For example, water and organic solvents can be blended to provide the best transport of the patterning compound to the substrate surface.

In general, the patterning compound and the ink in which the patterning compound resides is free of reactive monomer. In other words, the patterning does not involve a polymerization of the monomer to form conductive polymer.

Particular devices of interest include electronic, optical, and chemical and biological sensing devices including transistors (including field effect transistors, see reference 3 below), electrodes, and light-emitting diodes. The lithography can be carried out between electrodes, including nanogap electrodes, and the electrical characteristics of the nanostructures can be measured. The nanostructures can be made thicker for such measurements. The ability to control three dimensional size of conductive or semiconductive polymer patterns on the substrate is of significant commercial value in nano-device fabrication.

The following are among the benefits of the invention, using nanolithographic printing with nanoscopic tips:

1. Direct Write—the patterning deposits material directly onto a surface rather than using masks or stencils. Unlike various etching-based techniques, moveover, the method does not destroy any part of the substrate or pens. Importantly, it expands the number of potential substrate and deposition materials.

2. Ultrahigh resolution—Using the pen Systems manufactured by NanoInk, the method is capable of producing structures with diameters of less than about 10 nanometers. This is compared to photolithography, which supports features of no less than 100–120 nm linewidth, and slower e-beam and laser lithography systems, which support features of 50 nm linewidth.

3. Molecule generality—Direct fabrication is possible with many substances, from oligonucleotides to metals to the conducting polymers described herein. Some substances may require more specialized ambient conditions (e.g. humidity level), but a wide variety of substance are amenable to the process.

4. Low cost—the products are all low-cost research tools and extremely low-cost industrial tools. Techniques such as e-beam lithography that approach (but do not surpass) the resolution are orders of magnitude more expensive to purchase, set up and maintain.

5. Ease of use—the experiments may be performed by non-specialized personnel with minimal training. Further, the technique works under normal ambient laboratory conditions with humidity control.

6. Unparalleled registration—By leveraging existing atomic force microscopy technology, this nanolithography utilizes the best possible tool for determining exactly where features are being placed on the substrate. This allows for the integration of multiple component nanostructures and for immediate inspection and characterization of fabricated structures.

The method described herein, in sum, is a unique lithography tool that combines the high resolution of e-beam lithography with the ability to pattern non-traditional materials (such as conducting polymers and biomolecules) of micro-contact printing, the ease of use and automation of a computer printer and the promise of increasingly high-throughput as pen systems are developed to include tens and even hundreds of thousands of individually-controlled pens. The structures and patterns are smaller than those produced virtually any other way, cheaper to produce than any other technique, built under the supervision of individuals with only hours of training, viewable literally during fabrication, incorporate building materials that other techniques can not use, and allow for the use of multiple materials simultaneously.

Materials: The conducting polymers, poly(anilinesulfonic acid) (5 wt % aqueous solution, degree of sulfonation ca. 100%, Mn≈10,000, self-doped, R is proprietary to Aldrich) and polypyrrole (5 wt % aqueous solution, doping procedure, R⁻, and Mn are proprietary to Aldrich), were purchased from Aldrich Chemical Co. (Milwaukee, Wis.). Cystamine dihydrochloride (98%) and thioctic acid (98%) were purchased from Aldrich Chemical Co. and trimethoxysilylpropyldiethylenetriamine (DETA) (95%) were obtained from United Chemical Technologies (Piscataway, N.J.). All of the other chemicals (methanol, 2-propanol, sulfuric acid, hydrogen peroxide) were ACS grade from Fisher Scientific and were used without further purification. Nanopure water (>18.0 MΩ), obtained using a Barnstead NANOpure water system, was used for all substrate cleaning steps and preparatory steps calling for water. Si (100) wafers (4 in. diameter; 3–4.9 Ω/cm resistivity; 500 nm oxide layer; 500–550 mm thickness) were purchased from Silicon Quest International, Inc (Santa Clara, Calif.). Gold electrodes (60 nm Au, 10 nm Ti) were prepared by thermal evaporation according to previously reported procedures (see reference 25).

Preparation of Substrates: The silicon wafers were cleaned by immersion in a "piranha solution" ($H_2SO_4$:30% $H_2O$=7:3 (v/v)), (Caution: Piranha solutions are extremely dangerous and should be used with extreme caution) at 80° C. for 10 min and were subsequently washed several times with Nanopure water and dried with $N_2$. These substrates were used for printing of the positively charged polypyrrole. For printing of negatively charged poly(anilinesulfonic acid), a clean silicon substrate was silanized using a 2% solution of DETA in 2-propanol for 10 min, after which the substrates were washed thoroughly with 2-propanol and water, dried under $N_2$, and baked at 120° C. for 10 min. Monolayers of cystamine and thioctic acid on Au electrodes were prepared by soaking the electrodes in 10 mM water (cystamine) and 2-propanol (thioctic acid) solutions for 2 h. The cystamine and thioctic acid modified Au electrodes were rinsed three times with the water and 2-propanol, respectively, and dried under $N_2$. All modified substrates were used within 2 h of preparation.

Printing Procedure and AFM Imaging: All patterning and imaging experiments were carried out with a ThermoMicroscopes CP AFM driven by custom lithography software (NanoInk, Inc., Chicago, Ill.) and conventional $Si_3N_4$ cantilevers (ThermoMicroscopes Sharpened Microlever A, force constant=0.05 Nm). The tips were soaked in a 1 wt % polymer solution (water/methanol, ¼) for 10 s and blown dry with compressed difluoroethane prior to use. All patterning experiments described herein were conducted under ambient conditions at 28–30% relative humidity and 23° C. Subsequent imaging of the generated patterns was performed under the same conditions.

Electrochemical Instrumentation: Electrochemical experiments were performed with a Bioanalytical Systems (BAS) Model 100B in a conventional three-electrode cell. For the experiments, an electrolyte solution of 0.2 M NaCl in deionized water was used. The solution in the electrochemical cell was deaerated with $N_2$ gas before use. A Pt wire and a Ag/AgCl electrode (Bioanalytical Systems Inc.) were used as the counter and reference electrodes, respectively. A thermally evaporated Au film was used for the working electrode.

Substrate Surfaces: Two kinds of modified silicon oxide surfaces were utilized in these studies: a trimethoxysilylpropyldiethylenetriamine (DETA) modified positively charged surface, and a "piranha solution" generated negatively charged surface, Scheme 1. Others have studies and characterized the chemical nature of these surfaces (see references 19–21). In a typical printing or transport experiment, a tip coated with conducting polymer was brought into contact (0.5 nN) with the substrate surface at different locations under ambient conditions for successively longer periods of time, FIGS. 1 and 2. Lateral force microscopy (LFM) of the patterned area showed that the polymer spot size ranged from 130 nm to 1.3 μm and correlated with contact time. The transport rate for conducting polymers exhibited a $t_{½}$ dependence as predicted by the diffusion model for printing (see reference 22) and is consistent with what we have observed for small chain alkanethiols on gold (see references 4–5), hexamethyldisilazane on $SiO_2$ (see reference 8), and oligonucleotides on gold and $SiO_2$ (see reference 9). All features exhibited low lateral force as compared with the surrounding charged modified-oxide surface. As outlined in FIG. 1, the nanolithographically-generated polymer patterns were stabilized by electrostatic interactions between the charged polymer chains and the functionalized surfaces. Indeed, patterns of these conducting polymers generally could not be obtained on unmodified silicon surfaces. Furthermore, the negatively charged SPAN polymer generally could not be patterned on the negatively charged piranha-treated substrate, and the positively charged PPy could not be patterned on the positively charged DETA-modified surface. Therefore, it was concluded that the electrostatic interaction between the charged polymer chains and the oppositely charged substrate acted as a primary driving force in the printing process.

Others have utilized electrically biased electrodes to polymerize monomers on conducting substrates (see reference 13). The approach of the present invention differs from that approach in that no bias is required, and one can write on nonconducting substrates.

The dot size of both SPAN and PPy polymers can be controlled by varying the tip substrate contact time as has been demonstrated with lower molecular weight inks (see reference 11), FIGS. 2C and 2D, respectively. The smallest feature size generated with these polymer inks was about 130 nm in diameter. This is in contrast with the small molecule inks that can be patterned with 60 nm line-width resolution, and the 15 nm resolution that can be obtained with printing on atomically flat substrates. The polymers used here were water-soluble, and the diffusion was very fast compared to other water insoluble inks such as the alkanethiols used in previous studies, providing further evidence for meniscus driven transport. Finally, the charged nature and cleanliness of the surface was important to the patterning process. Use of freshly prepared substrates (used within about 2 h of preparation) helped in obtaining reproducible results. Line profiles of the polymer nanofeatures showed that their heights average 2 and 1.5 nm for the SPAN and PPy polymers, respectively, FIG. 3.

Since the conducting polymers used in the working example were both electrochemically active, the electrochemical signal of the patterns was measured to confirm that indeed polymer molecules were transported from the tip onto the surface (as opposed to soluble salts or contaminants). To accomplish this, Au electrodes were modified with either cystamine or thioctic acid to provide the positively and negatively charged surfaces, respectively. Consistent with the assumption of electrostatically driven transport, the patterns of the charged conducting polymers could not be formed on the bare Au surface. However, printing could be used to coat the electrode surfaces (~175 $mm^2$) with the conducting polymers on the appropriately pre-modified Au substrate. It is difficult to obtain cyclic voltammograms for the patterned electrodes because of high charging currents, but the redox potential of the polymers by differential pulse voltammetry (DPV) can be measured, FIGS. 4C and 4D. The cathodic peaks at 300 mV for SPAN and 335 mV for PPy were consistent with the solution measurements confirming that the printing process is, indeed, transporting the conducting polymers: DPV of SPAN and PPy polymers dissolved in 0.2 M aqueous NaCl exhibit peaks at 303 and 336 mV, respectively, FIGS. 4A and 4B. The $\Delta E_{½}$s of these polymers are 330 and 340 mV, respectively, as measured by cyclic voltammetry. These data were consistent with those taken by others for the solution dissolved polymers and correlate well with our measurements on the patterned electrode structures (references 23 and 24).

While various embodiments of the present invention have been described in detail, it is apparent that modifications and adaptations of those embodiments will occur to those skilled in the art. It is understood that such modifications and adaptations are within the spirit and scope of the present invention, as set forth in the following claims.

REFERENCES:
[1] A. P. Alivisatos, *Science* 1996, 271, 933.
[2] R. Jin, Y. Cao, C. A. Mirkin, K. L. Kelly, G. C. Schatz, J. G. Zheng, *Science* 2001, 294, 1901.
[3] Y. Cui, Q. Wei, H. Park, C. M. Lieber, *Science* 2001, 293, 1289.
[4] R. D. Piner, J. Zhu, F. Xu, S. Hong, C. A. Mirkin, *Science* 1999, 283, 661.
[5] S. Hong, J. Zhu, C. A. Mirkin, *Langmuir* 1999, 15, 7897.
[6] S. Hong, C. A. Mirkin, *Science* 2000, 288, 1808.
[7] B. L. Weeks, A. Noy, A. E. Miller, J. J. De Yoreo, *Phys. Rev. Lett.* 2002, 88, 255 505.
[8] A. Ivanisevic, C. A. Mirkin, *J. Am. Chem. Soc.* 2001, 123, 7887.
[9] L. M. Demers, D. S. Ginger, S. J. Park, Z. Li, S. W. Chung, C. A. Mirkin, *Science* 2002, in press.
[10] L. M. Demers, S. J. Park, T. A. Taton, Z. Li, C. A. Mirkin, *Angew. Chem. Int. Ed.* 2001, 40, 3071.
[11] A. Ivanisevic, J. H. Im, K. B. Lee, S. J. Park, L. M. Demers, K. J. Watson, C. S. Mirkin, *J. Am. Chem. Soc.* 2001, 123, 12424.
[12] Y. Li, B. W. Maynor, J. Liu, *J. Am. Chem. Soc.* 2001, 123, 2105.
[13] B. W. Maynor, S. F. Filocamo, M. W. Grinstaff, J. Liu, *J. Am. Chem. Soc.* 2002, 124, 522.
[14] A. Noy, A. E. Miller, J. E. Klare, B. L. Weeks, B. W. Woods, J. J. DeYoreo, *Nano Lett.* 2002, 2, 109.
[15] M. J. Loiacono, E. L. Granstrom, C. D. Frisbie, *J. Phys. Chem. B* 1998, 102, 1679.
[16] S. Holdcroft, *Adv. Mater.* 2001, 13, 1753.
[17] H. He, J. Zhu, N. J. Tao, L. A. Nagahara, I. Amlani, R. Tsui, *J. Am. Chem. Soc.* 2001, 123, 7730.
[18] Y. Furukawa, *J. Phys. Chem.* 1996, 100, 15644.
[19] I. Moriguchi, Y. Teraoka, S. Kagawa, J. H. Fendler, *Chem. Mater.* 1999, 11, 1603.
[20] J. H. Im, O. P. Kwon, J. H. Kim, S. H. Lee, *Macromolecules* 2000, 33, 9606.
[21] L. A. Chrisey, G. U. Lee, C. E. O'Ferrall, *Nucleic Acids Research* 1996, 24, 3031.
[22] J. Jang, S. Hong, G. C. Schatz, M. A. Ratner, *J. Chem. Phys.* 2001, 115, 2721.
[23] G. P. Kittlesen, H. S. White, M. S. Wrighton, *J. Am. Chem. Soc.* 1984, 106, 7389.
[24] T. Tatsuma, H. Matsui, E. Shouji, N. Oyama, *J. Phys. Chem.* 1996, 100, 14016.
[25] D. A. Weinberger, S. Hong, C. A. Mirkin, B. W. Wessel, T. G. Higgins, *Adv. Mater.* 2000, 12, 1600.

What is claimed is:

1. A method of lithography comprising:
transporting a patterning compound from a tip to a substrate surface to form a pattern on the substrate surface, wherein the patterning compound has a charged polymeric backbone with a first electrostatic charge and the substrate surface comprises functional groups which provide a second electrostatic charge which is opposite to the first electrostatic charge; and wherein the patterning compound is a conducting polymer.

2. The method according to claim 1, wherein the first electrostatic static charge of the polymeric backbone is a positive charge and the second electrostatic charge of the substrate surface functional groups is a negative charge.

3. The method according to claim 1, wherein the first electrostatic static charge of the polymeric backbone is a negative charge and the second electrostatic charge of the substrate surface functional groups is a positive charge.

4. The method according to claim 1, wherein the tip is a scanning probe microscopic tip.

5. The method according to claim 1, wherein the tip is an atomic force microscopic tip.

6. The method according to claim 1, wherein the tip is a non-hollow tip and the patterning compound is coated on the tip before it is transported.

7. The method according to claim 1, wherein the tip is a hollow tip and the patterning compound is transported through the hollow tip.

8. The method according to claim 1, wherein the patterning compound is transported in an ink composition comprising the patterning compound.

9. The method according to claim 1, wherein the patterning compound is transported in an ink composition comprising the patterning compound, and the ink composition comprises water.

10. The method according to claim 1, wherein the pattern includes at least one dot.

11. The method according to claim 1, wherein the pattern includes at least one line.

12. The method according to claim 1, wherein the pattern has a lateral dimension of about one micron or less.

13. The method according to claim 1, wherein the pattern has a lateral dimension of about 500 nm or less.

14. The method according to claim 1, wherein the pattern has a lateral dimension of about 130 nm to about 1.3 micron.

15. The method according to claim 1, wherein the pattern has a lateral dimension of about 100 nm to about 500 nm.

16. The method according to claim 1, wherein the pattern has a height of about 1 nm to about 5 nm.

17. The method according to claim 1, wherein the substrate comprises a semiconductor base and a surface layer which provides the functional groups.

18. The method according to claim 1, wherein the substrate comprises a non-electrically conducting base and a surface layer which provides the functional groups.

19. A method according to claim 1, wherein the patterning compound is a doped conducting polymer.

20. A method according to claim 1, wherein the patterning compound is a water-soluble doped conducting polymer.

21. A method according to claim 1, wherein the patterning compound is a synthetic polymer.

22. A method according to claim 1, wherein the patterning compound is an organic synthetic polymer.

23. The method according to claim 1, wherein the tip and the substrate surface are not electrically biased by an external voltage source during the transport.

24. The method according to claim 1, wherein the transport is carried out with a substrate surface prepared for transport within two hours of the transport.

25. A method according to claim 1, wherein the transport is carried out so that the pattern spreads in the shape of a dot, the transport is carried out with a contact time of about 3.5 seconds or less, and the dot has a radius during transport which is a linear function of the square root of the contact time.

26. A method according to claim 1, wherein the tip is an atomic force microscope tip, and wherein the pattern is a dot or line having a dot diameter or a line width, respectively, of about one micron or less.

27. The method according to claim 26, wherein the patterning compound is a conducting polymer.

28. The method according to claim 26, wherein the tip and the substrate surface are not electrically biased by an external voltage source during the transport.

29. A pattern on a substrate surface prepared by the method according to claim 1.

30. A method comprising:
providing a polymer comprising a charged polymer backbone;
providing a charged surface which is oppositely charged;
providing an atomic force microscope tip;
coating the atomic force microscope tip with the polymer;
transporting the polymer to the charged surface from the atomic force microscope tip to form a pattern of the polymer on the surface; and
wherein the polymer is a conducting polymer.

31. The method according to claim 30, wherein the polymer comprises a positively charged polymer backbone.

32. The method according to claim 30, wherein the polymer comprises a negatively charged polymer backbone.

33. The method according to claim 30, wherein the pattern includes at least one dot.

34. The method according to claim 30, wherein the pattern includes at least one line.

35. The method according to claim 30, wherein the pattern has a lateral dimension of about one micron or less.

36. The method according to claim 30, wherein the pattern has a lateral dimension of about 500 nm or less.

37. The method according to claim 30, wherein the pattern has a lateral dimension of about 130 nm to about 1.3 micron.

38. The method according to claim 30, wherein the pattern has a lateral dimension of about 100 nm to about 500 nm.

39. The method according to claim 30, wherein the polymer is a conducting polymer.

40. A method according to claim 30, wherein the polymer is an doped conducting polymer.

41. A method according to claim 30, wherein the polymer is a water-soluble doped conducting polymer.

42. A method according to claim 30, wherein the polymer is a synthetic polymer.

43. The method according to claim 30, wherein the tip and the surface are not electrically biased by an external voltage source during the transport.

44. A method according to claim 30, wherein the pattern is a dot or line having a dot diameter or line width, respectively, of about 130 nm to about 1.3 microns.

45. The method according to claim 30, wherein the tip and the surface are not electrically biased by an external voltage source during the transport.

46. The method according to claim 30, wherein the pattern is a dot having a dot diameter of about 100 nm to about 500 nm.

47. The method according to claim 30, wherein the pattern is a line having a line width of about 100 nm to about 500 nm.

48. The method according to claim 30, wherein the polymer is an organic synthetic polymer comprising a conjugated polymer backbone.

49. A pattern on a surface prepared by the method according to claim 30.

50. A method for direct-write nanolithography without use of photomasks, photoresists, stamps, or electrically biased nanoscopic tips or substrates, consisting essentially of:
providing an electrostatically charged substrate surface consisting essentially of charged functional groups,
providing an atomic force microscope tip coated with an electrostatically charged patterning compound consisting essentially of a charged polymer backbone,
wherein the charged substrate and the charged patterning compound are oppositely charged, and the patterning compound is a conducting polymer,
contacting the coated tip with the substrate to transport the charged patterning compound to the charged substrate surface and form nanoscale patterns on the surface.

51. The method according to claim 50, wherein the patterning compound is positively charged.

52. The method according to claim 50, wherein the patterning compound is negatively charged.

53. The method according to claim 50, wherein the nanoscale pattern is at least one dot or at least one line having a dot diameter or a line width, respectively, of about 130 nm to about 1.3 microns.

54. The method according to claim 50, wherein the patterning compound is a doped conducting polymer.

55. The method according to claim 50, wherein the patterning compound is a water-soluble doped conducting polymer.

56. The method according to claim 50, wherein the tip and the surface are not electrically biased by an external voltage source during the transport.

57. The method according to claim 56, wherein the pattern is a dot having a dot diameter of about 100 nm to about 500 nm, or the pattern is a line having a line width of about 100 nm to about 500 nm.

58. The method according to claim 56, wherein the pattern is an organic synthetic polymer comprising a conjugated polymer backbone.

59. A nanolithographic method consisting essentially of:
lithographically transporting a patterning compound from a tip to a substrate surface to form a pattern on the substrate surface, wherein the patterning compound is a charged synthetic conducting polymer polymeric compound with a first electrostatic charge and the substrate surface comprises functional groups which provide a second electrostatic charge which is opposite to the first electrostatic charge, wherein the pattern has a resolution of about 500 nm or less.

* * * * *